(12) United States Patent
Nikitin et al.

(10) Patent No.: US 8,618,674 B2
(45) Date of Patent: Dec. 31, 2013

(54) SEMICONDUCTOR DEVICE INCLUDING A SINTERED INSULATION MATERIAL

(75) Inventors: Ivan Nikitin, Regensburg (DE); Joachim Mahler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 180 days.

(21) Appl. No.: 12/237,968

(22) Filed: Sep. 25, 2008

(65) Prior Publication Data
US 2010/0072628 A1    Mar. 25, 2010

(51) Int. Cl.
| H01L 23/48 | (2006.01) |
| H01L 23/52 | (2006.01) |
| H01L 29/40 | (2006.01) |
| H01L 23/29 | (2006.01) |
| H01L 23/28 | (2006.01) |
| H01L 21/00 | (2006.01) |
| H01L 21/4763 | (2006.01) |

(52) U.S. Cl.
USPC ........... 257/778; 257/784; 257/787; 257/789; 257/790; 257/791; 257/792; 257/793; 257/794; 257/795; 257/796; 257/E21.158; 438/127; 438/618

(58) Field of Classification Search
None
See application file for complete search history.

(56) References Cited

U.S. PATENT DOCUMENTS

| 4,938,816 | A | 7/1990 | Beaman et al. |
| 5,724,727 | A | 3/1998 | Chopra et al. |
| 6,270,388 | B1 | 8/2001 | Lee |
| 2006/0003497 | A1* | 1/2006 | Farnworth .................... 438/127 |
| 2006/0145312 | A1* | 7/2006 | Liu et al. ....................... 257/666 |
| 2006/0248716 | A1* | 11/2006 | Weidner et al. ................. 29/843 |
| 2007/0148816 | A1* | 6/2007 | Davis et al. ................... 438/106 |
| 2007/0155050 | A1* | 7/2007 | Hashimoto ................... 438/106 |
| 2007/0215990 | A1* | 9/2007 | San Antonio et al. ........ 257/666 |
| 2007/0249748 | A1 | 10/2007 | Kura et al. |
| 2007/0259278 | A1 | 11/2007 | Kura et al. |
| 2007/0267218 | A1* | 11/2007 | Kimura et al. ................ 174/524 |
| 2008/0000061 | A1* | 1/2008 | Jeong et al. .................. 29/25.41 |
| 2009/0072379 | A1* | 3/2009 | Ewe et al. ..................... 257/700 |
| 2009/0072415 | A1* | 3/2009 | Mahler et al. ................. 257/784 |

FOREIGN PATENT DOCUMENTS

WO    03058677    7/2003

* cited by examiner

*Primary Examiner* — Michael Jung
(74) *Attorney, Agent, or Firm* — Dicke, Billig & Czaja, PLLC

(57) ABSTRACT

A semiconductor device includes a carrier and a first chip attached to the carrier. The semiconductor device includes a sintered insulation material over at least a portion of the carrier and the first chip.

24 Claims, 8 Drawing Sheets

SEMICONDUCTOR DEVICE INCLUDING A SINTERED INSULATION MATERIAL

BACKGROUND

Market demand for smaller and more functional electronic devices has driven the development of semiconductor devices, including semiconductor power packages and entire systems disposed on a chip. Some electronic devices, such as cellular telephones, employ a variety of design-specific electronic components. Other electronic devices, such as power packages utilized in the automotive industry, employ one or more logic chips connected to a leadframe and one or more power transistors connected to the leadframe and the logic chip(s). The space available inside the electronic devices is limited, particularly as the electronic devices are made smaller.

Dielectric or insulating materials having good thermal and mechanical characteristics are typically used within the electronic devices. The dielectric or insulating materials are typically structured using an encapsulation procedure due to the high processing temperatures and/or processing pressures for the materials. Typically, the insulating or dielectric structures are planar or surface-conformal, which may provide inadequate isolation at some points within the electronic devices, such as at chip edges.

For these and other reasons, there is a need for the present invention.

SUMMARY

One embodiment provides a semiconductor device. The semiconductor device includes a carrier and a first chip attached to the carrier. The semiconductor device includes a sintered insulation material over at least a portion of the carrier and the first chip.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
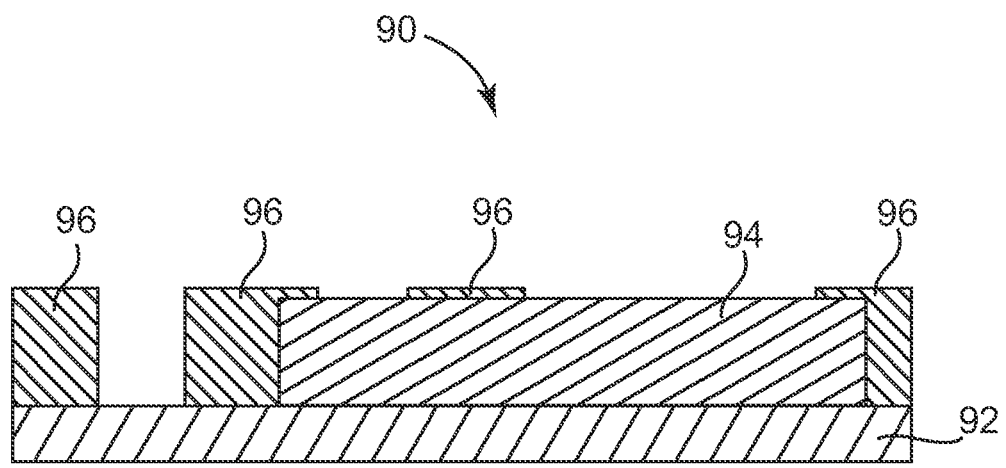
FIG. 1 illustrates a cross-sectional view of one embodiment of a semiconductor device.

FIG. 1 illustrates a cross-sectional view of one embodiment of a semiconductor device 90. Semiconductor device 90 includes a carrier 92, a chip 94, and sintered dielectric or insulation material 96. Chip 94 is attached to carrier 92. Sintered insulation material 96 is over at least a portion of carrier 92 and chip 94. During the fabrication of semiconductor device 90, a dielectric material powder is applied over carrier 92 and chip 94. A laser beam is then applied to portions of the dielectric material powder where insulation material is desired to be structured. The laser beam sinters the portions of the dielectric material powder to provide a sintered insulation material. The remaining unsintered dielectric material powder is then removed. The process of applying the dielectric material powder, sintering portions of the dielectric material powder, and removing the unsintered dielectric material powder can be repeated any suitable number of times to form any suitable insulating structure having a desired configuration.

Figure 2:
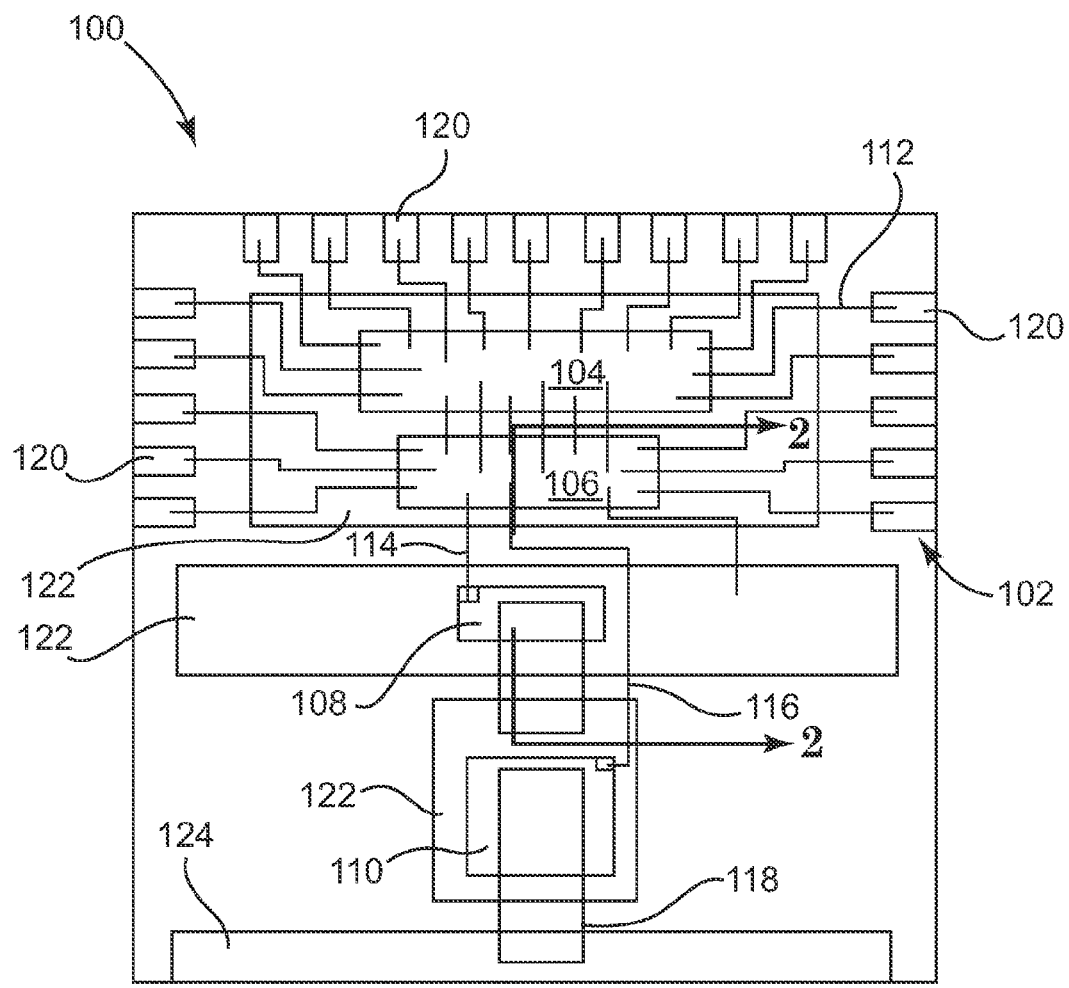
FIG. 2 illustrates a top view of one embodiment of a semiconductor device.

FIG. 2 illustrates a top view of one embodiment of a semiconductor device 100. In one embodiment, semiconductor device 100 is a semiconductor device power package. Semiconductor device 100 includes a sintered dielectric or insulating structure. Semiconductor device 100 includes a carrier 102, chips 104, 106, 108, and 110 coupled to carrier 102, a conducting element 112 extending between chip 104 and carrier 102, a conducting element 114 extending between chip 106 and chip 108, a conducting element 116 extending between chip 106 and chip 110, and a conducting element 118 extending between chip 110 and carrier 102. Semiconductor device 100 also includes other suitable electrical connections between chips 104, 106, 108, 110, and carrier 102.

In one embodiment, carrier 102 includes a leadframe having a plurality of connection heads or contact pads 120, one or more islands 122, and one or more connection strips 124. In one embodiment, carrier 102 includes a leadframe stamped from a plate of copper or another suitable conductor to include contact pads 120, islands 122, and connection strip 124. The components of carrier 102 are retained in a desired orientation until chips 104, 106, 108, and 110 are attached to islands 122 and appropriately electrically connected. In general, carrier 102 provides a support structure for semiconductor device 100 and includes a leadframe formed of metal such as copper, aluminum, an alloy of copper, an alloy of aluminum, or other suitable electrically conducting metal. In one embodiment, carrier 102 includes a quad flat no-lead (QFN) frame having contacts pads 120 on more than two sides. In another embodiment, carrier 102 includes a dual flat no-lead (DFN) frame having contact pads 120 on two opposing sides. In other embodiments, other suitable carriers are used.

In one embodiment, chips 104 and 106 are logic chips and chips 108 and 110 are power transistors. Power transistors 108 and 110 include wider conducting elements 118 electrically coupled to carrier 102 that are configured to bring power from the outside world to drive chips 104 and 106. In one embodiment, chip 104 is a controller chip and chip 106 is a driver chip, where chips 104 and 106 provide logic and processing for semiconductor device 100. In other embodiments, other suitable forms and styles of chips 104, 106, 108, and 110 are used.

Conducting elements 112, 114, 116, and 118 electrically connect components disposed on carrier 102 to the outside world. In one embodiment, conducting elements 112, 114, 116, and 118 are sintered metallic lines accurately traced onto carrier 102 and coupled to chips 104, 106, 108, and 110 in a direct process. Conducting elements 112 and 114 are generally electrically conducting element having a line width of between about 1-20 micrometers and couple between one or more chips 104, 106, 108, and 110 or between chips 104, 106, 108, and 110 and one or more pads 120 of carrier 102. Conducting element 118 is fabricated to be wider than conducting elements 112 and 114. In one embodiment, conducting element 118 is a high voltage sintered line having a width of between about 15-50 micrometers and is electrically coupled between power transistors 108 and 110 and carrier 102.

Figure 3:
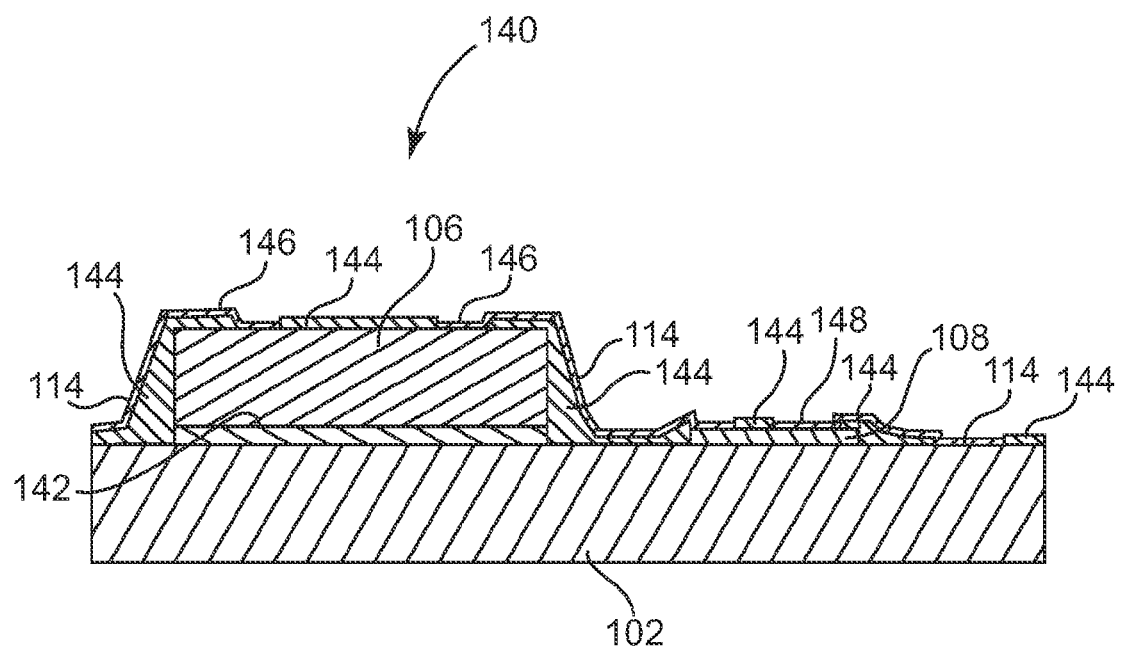
FIG. 3 illustrates a cross-sectional view of one embodiment of a portion of the semiconductor device illustrated in FIG. 2.

FIG. 3 illustrates a cross-sectional view of one embodiment of a portion 140 of semiconductor device 100 taken along line 2-2 of FIG. 2. The cross-section represents a semiconductor device 140 including logic chip 106 and power transistor 108 attached to carrier 102 and including conducting elements 114 electrically coupling logic chip 106, power transistor 108, and carrier 102.

In one embodiment, logic chip 106 is attached to carrier 102 by an adhesive 142 or another suitable attachment material. Power transistor 108 is likewise attached to carrier 102. In one embodiment, power transistor 108 is adhesively attached to carrier 102. In another embodiment, power transistor 108 is vertically integrated into carrier 102. A sintered dielectric material 144 is formed around and over portions of logic chip 106, power transistor 108, and carrier 102. Sintered dielectric material 144 electrically insulates portions of logic chip 106, power transistor 108, and carrier 102.

Embodiments provided herein and described below include the sintered dielectric material 144 and sintered conducting elements 114 electrically connected to logic chip 106 and power transistor 108 and extending over portions of sintered dielectric material 144. In one embodiment, a conducting element 114 defines an uppermost contact surface 146 of logic chip 106 and the conducting element 114 is sintered between logic chip 106 and uppermost contact surface 146. In other words, an entire depth of the conducting element 114 is sintered between logic chip 106 and uppermost contact surface 146. Similarly, a conducting element 114 is sintered between power transistor 108 and an uppermost surface 148 of power transistor 108.

The following FIGS. 4-10 illustrates embodiments of a method for fabricating semiconductor device 140 previously described and illustrated with reference to FIG. 3.

Figure 4:
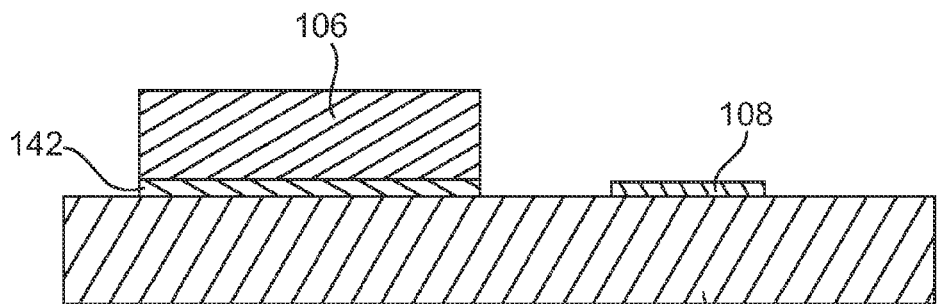
FIG. 4 illustrates a cross-sectional view of one embodiment of a carrier, a logic chip, and a power transistor.

FIG. 4 illustrates a cross-sectional view of one embodiment of a carrier 102, a logic chip 106, and a power transistor 108. Logic chip 106 is attached to carrier 102 using adhesive 142 or another suitable attachment material. Power transistor 108 is likewise attached to carrier 102. In one embodiment, power transistor 108 is adhesively attached to carrier 102. In another embodiment, power transistor 108 is vertically integrated into carrier 102.

Figure 5:
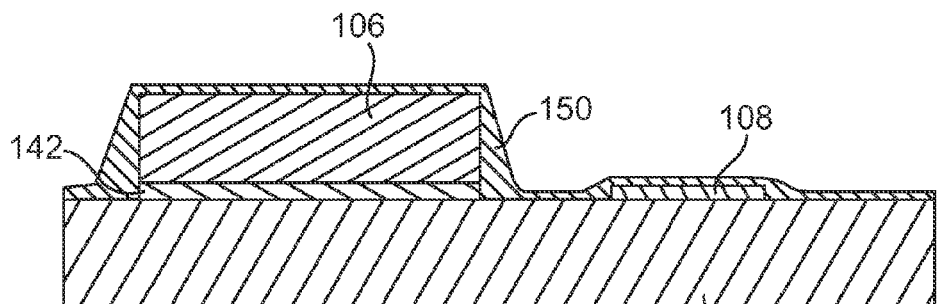
FIG. 5 illustrates a cross-sectional view of one embodiment of the carrier, the logic chip, the power transistor, and a dielectric material powder.

FIG. 5 illustrates a cross-sectional view of one embodiment of carrier 102, logic chip 106, power transistor 108, and dielectric material powder 150. Dielectric material powder 150 include particles of a polyimide, a polyisocyanate, a polyurethane, a liquid-crystalline polymer, a high-temperature-resistant thermoplastic, a duroplast, a silicone, a copolymer, a phenol resin, an amino resin, a siloxane, an unsaturated polyester, a polybenzoxazole, a polybenzimidazole, an epoxide, a ceramic, $TiO_2$, $ZrO_2$, $Al_2O_3$, $SiO_2$, or other suitable dielectric material powder. In one embodiment, dielectric material powder 150 is selected to have a particle size of between about 2 nanometers (nm) to 10 micrometers (μm), and preferably the particle size is between about 5 nm to 1 μm. The dielectric material powder is applied electrostatically or by using another suitable technique.

Figure 6:
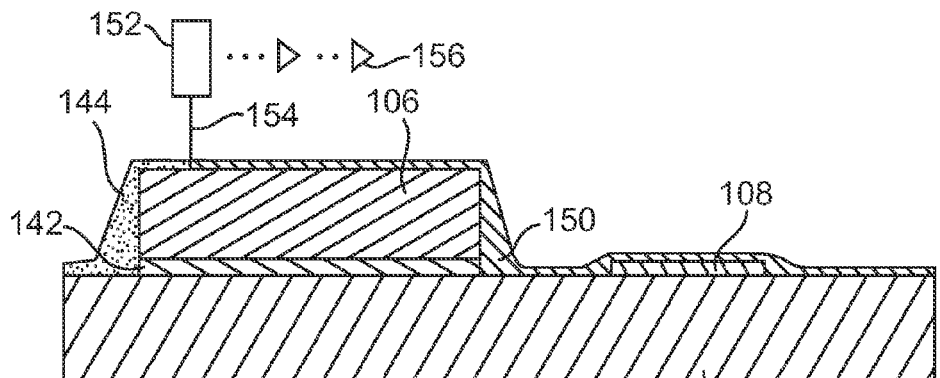
FIG. 6 illustrates a cross-sectional view of one embodiment of the carrier, the logic chip, the power transistor, and the dielectric material powder during sintering of the dielectric material powder.

FIG. 6 illustrates a cross-sectional view of one embodiment of carrier 102, logic chip 106, power transistor 108, and dielectric material powder 150 during sintering of the dielectric material powder. Dielectric material powder 150 is sintered to provide sintered dielectric material 144. Dielectric material powder 150 is sintered by a laser 152. Laser 152 is directed in a path to the right for example, as indicated by arrows 156. Laser 152 provides a beam 154 that moves along the surface of carrier 102, logic chip 106, and power transistor 108 and sinters the dielectric material powder 150 in contact with beam 154. The particles in dielectric material powder 150 that are energetically affected by beam 154 are sintered to form sintered dielectric material 144.

In one embodiment, laser 152 includes a neodymium-doped yttrium aluminum garnet (Nd:YAG) solid state laser, a $CO_2$ or gas laser, a diode laser, or other suitable electron beam high energy source. In one embodiment, the Nd:YAG laser has a power between 100-2000 watts operating at a speed between 40-80 mm/s. In other embodiments, other suitable lasers operated at other powers and transport speeds are used. In general the Nd:YAG laser emits light at a wave length of about 1064 nanometers in the infrared spectrum, although transitions near the 940, 1120, 1320, and 1440 nanometer range are present. Suitable lasers may be operated in both pulsed and/or continuous mode. One suitable Nd:YAG laser is available from Han's Laser Technology Company, Houston, Tex.

Figure 7:
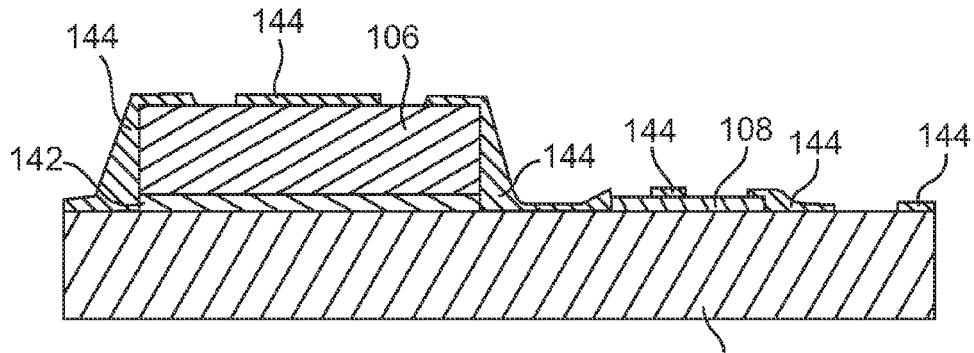
FIG. 7 illustrates a cross-sectional view of one embodiment of the carrier, the logic chip, the power transistor, and sintered dielectric material after removing the unsintered dielectric material powder.

FIG. 7 illustrates a cross-sectional view of one embodiment of carrier 102, logic chip 106, power transistor 108, and sintered dielectric material 144 after removing unsintered dielectric material powder 150. The dielectric material powder 150 that is not sintered by laser 152 is removed from logic chip 106, power transistor 108, and carrier 102 by a suitable removal process, such as washing, air pistol, etc. to expose portions of logic chip 106, power transistor 108, and carrier 102.

Figure 8:
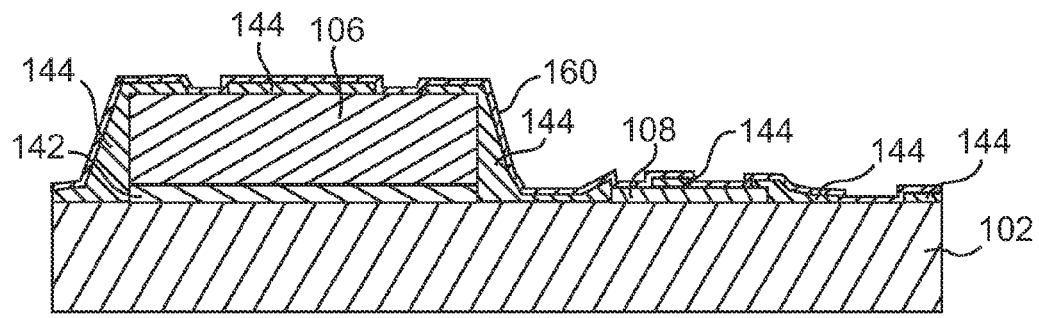
FIG. 8 illustrates a cross-sectional view of one embodiment of the carrier, the logic chip, the power transistor, the sintered dielectric material, and a metal powder.

FIG. 8 illustrates a cross-sectional view of one embodiment of carrier 102, logic chip 106, power transistor 108, sintered dielectric material 144, and a metal powder 160. Metal powder 160 includes silver powder, gold powder, nickel powder, copper powder, or other suitable electrically conducting metals provided in a powdered form. In one embodiment, metal powder 160 is silver powder that is evenly distributed over an upper surface of carrier 102, logic chip 106, power transistor 108, and sintered dielectric material 144. Silver has a low susceptibility to oxidation. Silver powder is suited for distribution over the upper surfaces of logic chip 106, power transistor 108, and carrier 102 without special consideration for the local atmosphere. In other embodiments, copper powder is evenly distributed over components placed on carrier 102 and is preferably deposited in an inert atmosphere such as a nitrogen atmosphere.

Metal powder 160 is selected to have a particle size of between about 2 nm to 10 µm, and preferably the particle size is between about 5 nm to 1 µm. In one embodiment, metal powder 160 includes silver particles having an average particle size of about 5 nm that are subsequently sintered by a high energy process to provide a conducting line having a width between about 20-50 µm and a thickness between about 1-5 µm. It has been discovered that particle sizes of less than 50 nm reduce the sintering temperature significantly, and that particle sizes of about 5 nm reduce the sintering temperature to less than about one third of the melting point for the alloy in a manner that sintering is done without pressure. It is desired that the porosity of the metal powder 160 be minimized, which results in the thermal and electrical performance being maximized.

Figure 9:
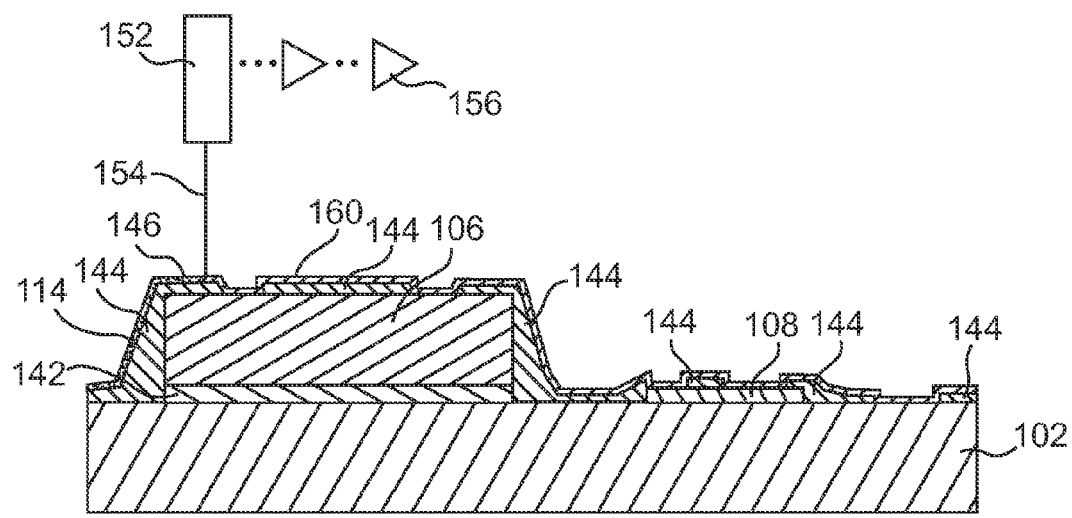
FIG. 9 illustrates a cross-sectional view of one embodiment of the carrier, the logic chip, the power transistor, the sintered dielectric material, and the metal powder during sintering of the metal powder.

FIG. 9 illustrates a cross-sectional view of one embodiment of the carrier 102, logic chip 106, power transistor 108, sintered dielectric material 144, and metal powder 160 during sintering of the metal powder. Laser 152 is directed in a path to the right for example, as indicated by arrows 156. Laser beam 154 moves along the surface of carrier 102, logic chip 106, and power transistor 108 and sinters the metal powder 160 in contact with beam 154. The particles in metal powder 160 that are energetically affected by beam 154 are sintered to form conducting elements 114.

Figure 10:
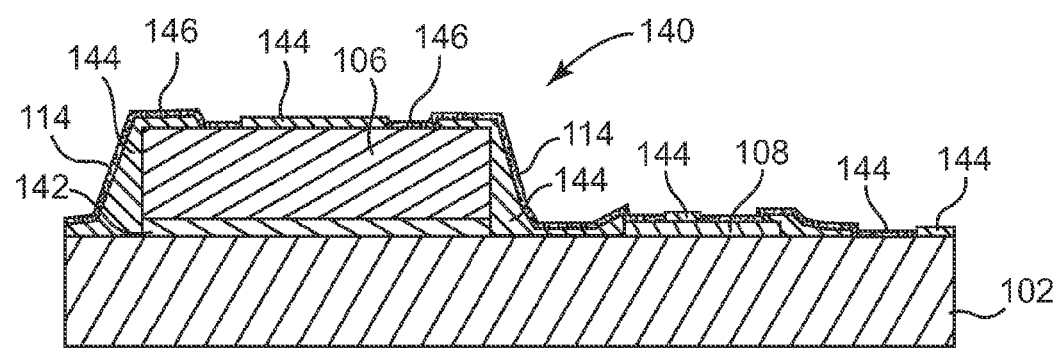
FIG. 10 illustrates a cross-sectional view of one embodiment of the carrier, the logic chip, the power transistor, the sintered dielectric material, and conducting elements after removing the unsintered metal powder.

FIG. 10 illustrates a cross-sectional view of one embodiment of carrier 102, logic chip 106, power transistor 108, sintered dielectric material 144, and conducting elements 114 after removing unsintered metal powder 160. The particles of metal powder 160 that are not sintered by laser 152 are removed from logic chip 106, power transistor 108, and carrier 102 by a suitable removal process, such as washing, air pistol, etc. to provide conducting elements 114. In one embodiment, a conducting element 114 electrically connects logic chip 106 to power transistor 108 and extends over a portion of a non-planar sintered dielectric material 144. In contrast to conventional lithographic approaches, conducting element 114 is configured to be relatively thin compared to the thickness of logic chip 106 and power transistor 108. In addition, conducting element 114 conforms to (i.e., is conformally deposited over) sintered dielectric material 144 in a one-pass process.

Figure 11:
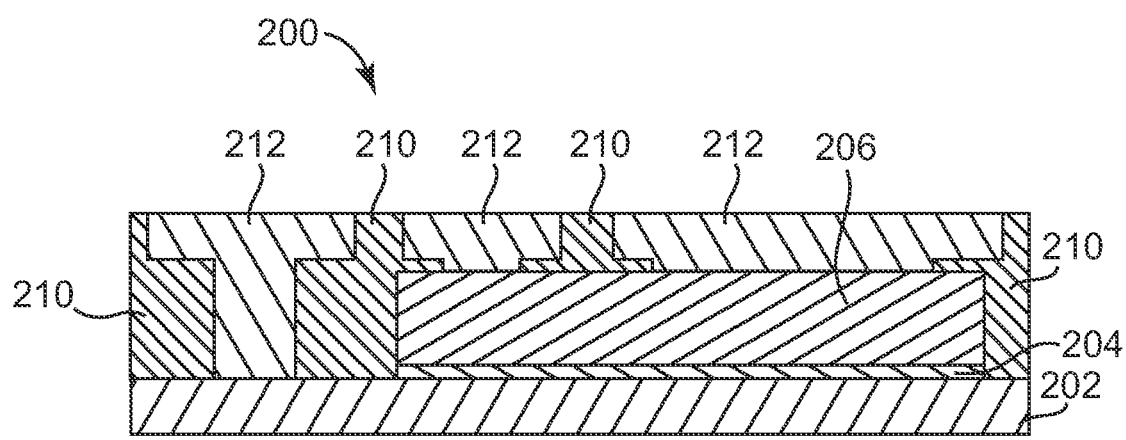
FIG. 11 illustrates a cross-sectional view of another embodiment of a semiconductor device.

FIG. 11 illustrates a cross-sectional view of another embodiment of a semiconductor device 200. Semiconductor device 200 includes a carrier 102, a chip 206, sintered dielectric material 210, and conducting elements 212. Chip 206 is attached to carrier 202 by an adhesive material 204 or another suitable attachment material. Sintered dielectric material 210 insulates portions of chip 206 and carrier 202. Sintered dielectric material 210 defines vias to carrier 202 and contacts to chip 206 in which conducting elements 212 are formed. In one embodiment, conducting elements 212 include sintered metal powder.

The following FIGS. 12-16 illustrate embodiments of a method for fabricating semiconductor device 200 previously described and illustrated with reference to FIG. 11.

Figure 12:
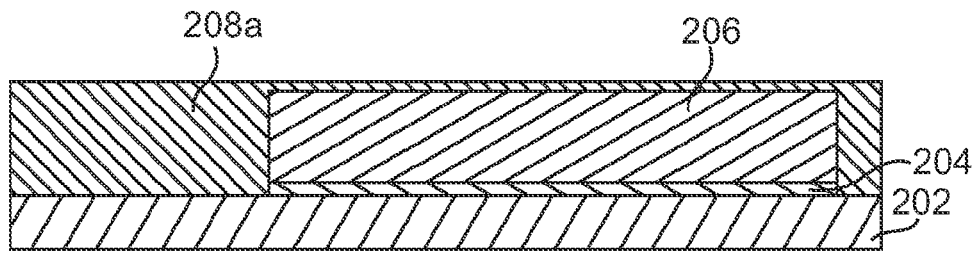
FIG. 12 illustrates a cross-sectional view of one embodiment of a carrier, a chip, and first dielectric material powder.

FIG. 12 illustrates a cross-sectional view of one embodiment of carrier 202, chip 206, and first dielectric material powder 208*a*. Chip 206 is attached to carrier 202 by an adhesive material 204 or another suitable attachment material. First dielectric material powder 208*a* is then distributed over carrier 202 and chip 206. First dielectric material powder 208*a* is similar to dielectric material powder 150 previously described and illustrated with reference to FIG. 5.

Figure 13:
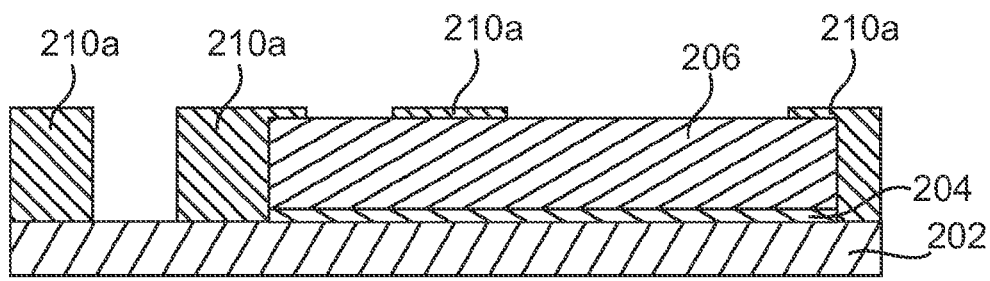
FIG. 13 illustrates a cross-sectional view of one embodiment of the carrier, the chip, and first sintered dielectric material after sintering portions of the first dielectric material powder and removing the unsintered first dielectric material powder.

FIG. 13 illustrates a cross-sectional view of one embodiment of carrier 202, chip 206, and first sintered dielectric material 210*a* after sintering portions of first dielectric material powder 208*a* and removing the unsintered first dielectric material powder. First dielectric material powder 208*a* is sintered using a laser beam as previously described and illustrated with reference to FIG. 6 to provide sintered dielectric material 210*a*. The unsintered dielectric material powder 208*a* is then removed to expose portions of carrier 202 and chip 206. The unsintered dielectric material powder 208*a* is removed from chip 206 and carrier 202 by a suitable removal process, such as washing, air pistol, etc.

Figure 14:
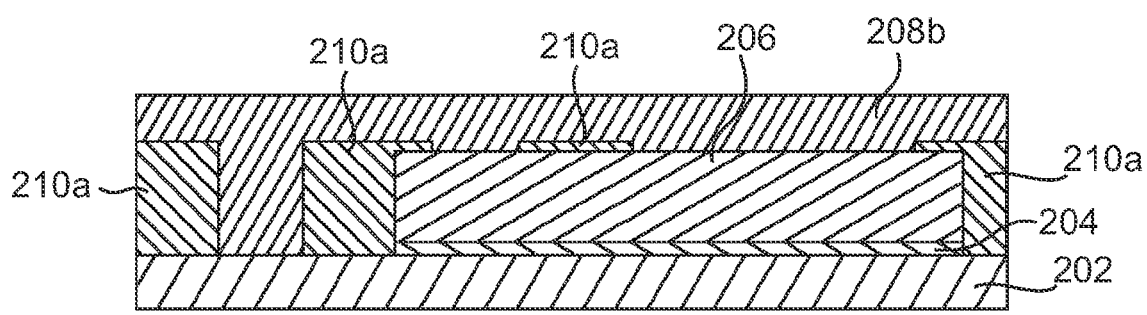
FIG. 14 illustrates a cross-sectional view of one embodiment of the carrier, the chip, the first sintered dielectric material, and second dielectric material powder.

FIG. 14 illustrates a cross-sectional view of one embodiment of carrier 202, chip 206, first sintered dielectric material 210*a*, and second dielectric material powder 208*b*. Second dielectric material powder 208*b* is distributed over first sintered dielectric material 210*a*, carrier 202, and chip 206. Second dielectric material powder 208*b* is similar to dielectric material powder 150 previously described and illustrated with reference to FIG. 5.

Figure 15:
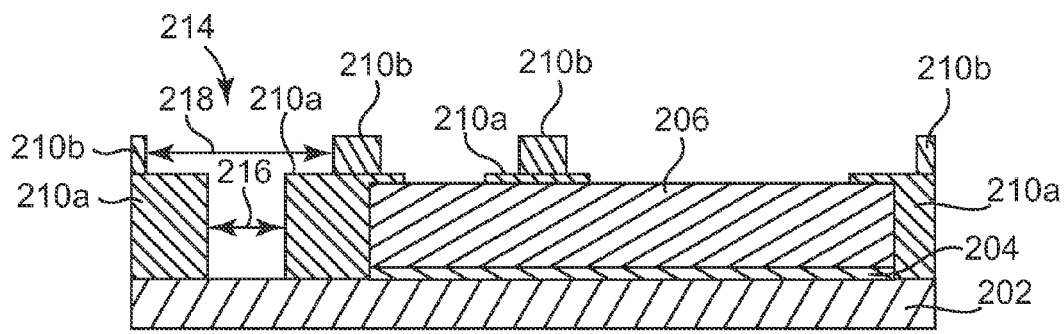
FIG. 15 illustrates a cross-sectional view of one embodiment of the carrier, the chip, the first sintered dielectric material, and second sintered dielectric material after sintering portions of the second dielectric material powder and removing the unsintered second dielectric material powder.

FIG. 15 illustrates a cross-sectional view of one embodiment of carrier 202, chip 206, first sintered dielectric material 210a, and second sintered dielectric material 210b after sintering portions of second dielectric material powder 208b and removing the unsintered second dielectric material powder. Second dielectric material powder 208b is sintered using a laser beam as previously described and illustrated with reference to FIG. 6 to provide sintered dielectric material 210b. The unsintered dielectric material powder 208b is then removed to expose portions of first sintered dielectric material 210a, carrier 202, and chip 206. The unsintered dielectric material powder 208b is removed from first sintered dielectric material 210a, chip 206, and carrier 202 by a suitable removal process, such as washing, air pistol, etc. In this way, sintered dielectric material layer 210b is structured upon sintered dielectric material layer 210a to provide insulating material having a desired structure.

In one embodiment, sintered dielectric material layers 210a and 210b are structured to provide openings or vias having more than one cross-sectional width. For example, opening or via 214 is defined by first sintered dielectric material 210a and second sintered dielectric material 210b. Opening 214 has a first cross-sectional width as indicated at 216 defined by first sintered dielectric material 210a. Opening 214 has a second cross-sectional width as indicated at 218 defined by second sintered dielectric material 210b. The second cross-sectional width indicated at 218 is greater than the first cross-sectional width indicated at 216.

The process of applying the dielectric material powder, sintering a portion of the dielectric material powder, and removing the unsintered dielectric material powder can be repeated any suitable number of times to provide any suitable insulating structure. In one embodiment, the unsintered dielectric material powder that is removed is reused in a following application of the dielectric material powder.

Figure 16:
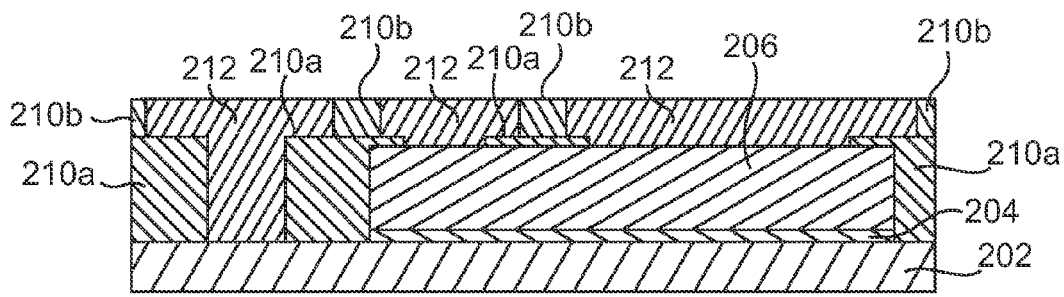
FIG. 16 illustrates a cross-sectional view of one embodiment of the carrier, the chip, the first sintered dielectric material, the second sintered dielectric material, and conducting elements.

FIG. 16 illustrates a cross-sectional view of one embodiment of carrier 202, chip 206, first sintered dielectric material 210a, second sintered dielectric material 210b, and conducting elements 212. Conducting elements 212 are formed in the vias or openings defined by first sintered dielectric material 210a and second sintered dielectric material 210b. In one embodiment, conducting elements 212 are provided by applying a metal powder and sintering the metal powder as previously described and illustrated with reference to FIGS. 8-10. In other embodiments, metal is deposited over carrier 202, sintered dielectric material 210a and 210b, and chip 206 and then planarized and/or etched to expose second sintered dielectric material 210b to provide conducting elements 212.

Figures 17A, 17B, 17C:
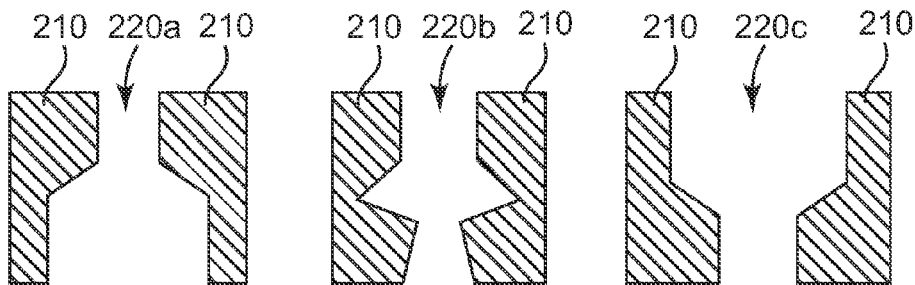
FIG. 17A illustrates a cross-sectional view of one embodiment of a via.
FIG. 17B illustrates a cross-sectional view of another embodiment of a via.
FIG. 17C illustrates a cross-sectional view of another embodiment of a via.

FIGS. 17A-17C each illustrate a cross-sectional view of one embodiment of a via 220a, a via 220b, and a via 220c, respectively. Vias 220a, 220b, and 220c are defined by sintered dielectric material 210. In one embodiment, vias 220a, 220b, and/or 220c are used in semiconductor device 200 previously described and illustrated with reference to FIG. 11. Vias 220a, 220b, and 220c are structured by repeating, a suitable number of times, the process of applying dielectric material powder, sintering a portion of the dielectric material powder, and removing the unsintered dielectric material powder to provide vias 220a, 220b, and 220c having a desired structure.

Via 220a has a bottle-like shape having a plurality of cross-sectional widths. Via 220b has a cross-like shape having a plurality of cross-sectional widths. Via 220c has an upside down bottle-like shape having a plurality of cross-sectional widths. In other embodiments, vias having other suitable three dimensional shapes are defined by sintered dielectric material 210 such that the vias have at least two cross-sectional widths.

Figures 18A, 18B, 18C:
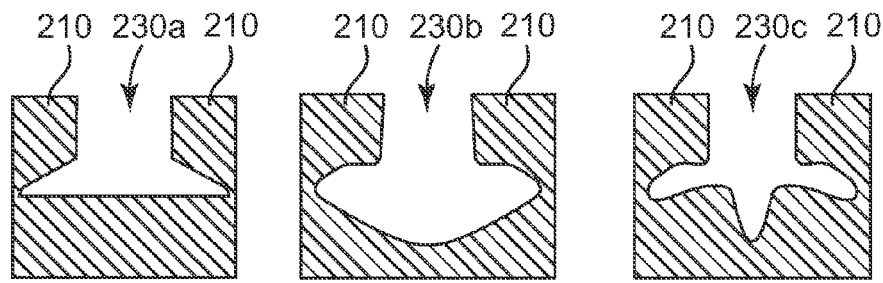
FIG. 18A illustrates a cross-sectional view of one embodiment of an opening for adhesion to a mold compound.
FIG. 18B illustrates a cross-sectional view of another embodiment of an opening for adhesion to a mold compound.
FIG. 18C illustrates a cross-sectional view of another embodiment of an opening for adhesion to a mold compound.

FIGS. 18A-18C each illustrate a cross-sectional view of one embodiment of an opening 230a, an opening 230b, and an opening 230c, respectively, for adhesion to a mold compound. Openings 230a, 230b, and 230c are defined by sintered dielectric material 210. In one embodiment, opening 230a, 230b, and/or 230c are used in semiconductor device 200 previously described and illustrated with reference to FIG. 11. Openings 230a, 230b, and 230c are structured by repeating, a suitable number of times, the process of applying dielectric material powder, sintering a portion of the dielectric material powder, and removing the unsintered dielectric material powder to provide openings 230a, 230b, and 230c having a desired structure.

Opening 230a has a triangle-like shape having a plurality of cross-sectional widths. Opening 230b has an oblong-like shape having a plurality of cross-sectional widths. Opening 230c has a multiple finger-like shape having a plurality of cross-sectional widths. In other embodiments, openings having other suitable three dimensional shapes are defined by sintered dielectric material 210 such that the openings have at least two cross-sectional widths.

Embodiments provide semiconductor devices, such as semiconductor power device packages, including structured dielectric material. The dielectric material is structured by selectively sintering dielectric material powder using a laser beam. In one embodiment, the unsintered dielectric material powder is removed for reuse. In one embodiment, the process of applying the dielectric material powder, sintering portions of the dielectric material powder, and removing the unsintered dielectric material powder is repeated any suitable number of times to provide any suitable insulating material structure.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
   a leadframe;
   a first chip attached to the leadframe; and
   a sintered insulation material over at least a portion of the leadframe and the first chip,
   wherein the sintered insulation material defines at least one opening, the at least one opening including a first portion having a first cross-sectional width and a second portion having a second cross-sectional width less than the first cross-sectional width, the first portion between the second portion and the leadframe, and the first portion and the second portion spaced apart from the first chip, and
   wherein a conducting element is formed in the first portion and the second portion of the at least one opening or the at least one opening is for adhesion to a mold compound.

2. The semiconductor device of claim 1, further comprising:
   at least one second chip attached to the leadframe,
   wherein the sintered insulation material is over at least a portion of the at least one second chip.

3. The semiconductor device of claim 2, wherein the first chip comprises a logic chip and the at least one second chip comprises a power transistor.

4. The semiconductor device of claim 1, wherein the sintered insulation material defines at least one via to at least one of the leadframe and the first chip.

5. The semiconductor device of claim 4, wherein the at least one via includes a first via portion having a first cross-sectional width and a second via portion having a second cross-sectional width different from the first cross-sectional width of the first via portion.

6. The semiconductor device of claim 1, wherein the sintered insulation material defines at least one contact to at least one of the leadframe and the first chip.

7. The semiconductor device of claim 1, wherein the at least one opening has one of a bottle-like shape, a cross-like shape, a triangle-like shape, an oblong-like shape, and a multiple finger-like shape.

8. The semiconductor device of claim 1, further comprising:
a conducting element electrically coupled with the first chip and extending over at least a portion of the sintered insulation material.

9. The semiconductor device of claim 8, wherein the conducting element comprises a sintered region.

10. A semiconductor device comprising:
a carrier;
a first chip and a second chip attached to the carrier by an attachment material;
a sintered insulation material over at least a portion of the carrier, at least a portion of the first chip, and at least a portion of the second chip;
a first metal line over the sintered insulation material and electrically coupling the first chip to the second chip; and
a second metal line electrically coupling the second chip to the carrier,
wherein the sintered insulation material comprises one of a sintered phenol resin, a sintered amino resin, a sintered siloxane, a sintered unsaturated polyester, a sintered polybenzoxazole, a sintered polybenzimidazole, a sintered epoxide, and a sintered ceramic, and
wherein the sintered insulation material defines at least one opening, the at least one opening including a first portion having a first cross-sectional width and a second portion having a second cross-sectional width less than the first cross-sectional width, the first portion between the second portion and the carrier, and the first portion and the second portion spaced apart from the first chip and the second chip.

11. The semiconductor device of claim 10, wherein the first metal line comprises a first sintered metal line, and
wherein the second metal line comprises a second sintered metal line.

12. The semiconductor device of claim 10, wherein the first chip comprises a logic chip and the second chip comprises a power transistor that is thinner than the logic chip.

13. The semiconductor device of claim 10, wherein the first portion is aligned with the first chip in a direction parallel to the carrier.

14. A semiconductor device comprising:
a carrier;
a chip having a first side and a second side opposite the first side, the chip attached to the carrier with the first side of the chip facing the carrier;
a sintered insulation material over at least a portion of the carrier and the second side of the chip; and
as first conducting element directly contacting the second side of the chip, and the sintered insulation material,
wherein the sintered insulation material defines at least one opening, the at least one opening including a first portion having a first cross-sectional width and a second portion having a second cross-sectional width less than the first cross-sectional width, the first portion between the second portion and the carrier, and the first portion and the second portion spaced apart from the chip, and
wherein a second conducting element is formed in the first portion and the second portion of the at least one opening or the at least one opening is for adhesion to a mold compound.

15. The semiconductor device of claim 14, wherein the carrier comprises a quad flat no-lead frame.

16. The semiconductor device of claim 14, wherein the carrier comprises a dual flat no-lead frame.

17. The semiconductor device of claim 14, wherein the first conducting element comprises a sintered metallic line.

18. The semiconductor device of claim 14, wherein the first conducting element is arranged on a surface of the sintered insulation material and extends below the second side of the chip.

19. The semiconductor device of claim 14, wherein the sintered insulation material has a surface extending below the second side of the chip.

20. A semiconductor device comprising:
a leadframe,
a first chip having a first side and a second side opposite the first side, the first chip attached to the leadframe with the first side of the first chip facing the leadframe;
a second chip having a first side and a second side opposite the first side, the second chip attached to the leadframe with the first side of the second chip facing the leadframe;
a sintered insulation material over at least a portion of the leadframe, at least a portion of the second side of the first chip, and at least a portion of the second side of the second chip;
a first metal line directly contacting the sintered insulation material, the second side of the first chip, and the second side of the second chip; and
a second metal line directly contacting the sintered insulation material, the second side of the second chip, and the leadframe,
wherein the sintered insulation material comprises one of a sintered phenol resin, a sintered amino resin, a sintered siloxane, a sintered unsaturated polyester, a sintered polybenzoxazole, a sintered polybenzimidazole, a sintered epoxide, and a sintered ceramic, and
wherein the sintered insulation material defines at least one opening, the at least one opening including a first portion having a first cross-sectional width and a second portion having a second cross-sectional width less than the first cross-sectional width, the first portion between the second portion and the leadframe, and the first portion and the second portion spaced apart from the first chip and the second chip.

21. The semiconductor device of claim 20, wherein the distance between the first and second sides of the first chip is greater than the distance between the first and second sides of the second chip.

22. The semiconductor device of claim 20, wherein the first metal line comprises a first sintered metal line extending below the second side of the first chip, and wherein the second metal line comprises a second sintered metal line extending below the second side of the second chip.

23. The semiconductor device of claim 20, wherein the sintered insulation material has a surface extending below the second side of the first chip.

24. The semiconductor device of claim 23, wherein the sintered insulation material has a surface extending below the second side of the second chip.

\* \* \* \* \*

UNITED STATES PATENT AND TRADEMARK OFFICE
CERTIFICATE OF CORRECTION

PATENT NO.        : 8,618,674 B2
APPLICATION NO.   : 12/237968
DATED             : December 31, 2013
INVENTOR(S)       : Nikitin et al.

It is certified that error appears in the above-identified patent and that said Letters Patent is hereby corrected as shown below:

In the Claims

Claim 14, Column 10, line 1, delete "as first" and insert in place thereof --a first--.

Signed and Sealed this
Twenty-first Day of October, 2014

Michelle K. Lee
*Deputy Director of the United States Patent and Trademark Office*